United States Patent
Coleman et al.

(10) Patent No.: US 7,339,968 B2
(45) Date of Patent: Mar. 4, 2008

(54) CURRENT BIASED DUAL DBR GRATING SEMICONDUCTOR LASER

(75) Inventors: James J. Coleman, Monticello, IL (US); S. David Roh, Allen, TX (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 79 days.

(21) Appl. No.: 10/778,599

(22) Filed: Feb. 13, 2004

(65) Prior Publication Data

US 2005/0180479 A1 Aug. 18, 2005

Related U.S. Application Data

(63) Continuation of application No. 09/660,611, filed on Sep. 13, 2000, now Pat. No. 6,728,290.

(51) Int. Cl.
*H01S 5/00* (2006.01)
*H01S 3/10* (2006.01)
*H01S 3/08* (2006.01)

(52) U.S. Cl. .................. 372/50.11; 372/23; 372/96
(58) Field of Classification Search ............ 372/23, 372/50.11, 96
See application file for complete search history.

(56) References Cited

U.S. PATENT DOCUMENTS

| | | | |
|---|---|---|---|
| 4,826,282 A | 5/1989 | Alferness | 350/96.12 |
| 4,920,542 A | 4/1990 | Brosson et al. | 372/50 |
| 5,003,550 A | 3/1991 | Welch et al. | 372/50 |
| 5,048,040 A | 9/1991 | Paoli | 372/50 |
| 5,155,736 A | 10/1992 | Ono et al. | 372/20 |
| 5,325,380 A | 6/1994 | Clendening et al. | 372/23 |
| 5,325,392 A | 6/1994 | Tohmori et al. | 372/96 |
| 5,351,262 A | 9/1994 | Poguntke et al. | 372/102 |
| 5,379,318 A * | 1/1995 | Weber | 372/96 |
| 5,440,576 A | 8/1995 | Welch et al. | 372/50 |
| 5,473,625 A | 12/1995 | Hansen et al. | 372/96 |
| 5,568,311 A | 10/1996 | Matsumoto | 359/344 |
| 5,581,572 A * | 12/1996 | Delorme et al. | 372/50.11 |
| 5,648,978 A | 7/1997 | Sakata | 372/50 |

(Continued)

OTHER PUBLICATIONS

S.D. Roh, K.E. Lee, J.S. Hughes, J.J. Coleman, Single and Tunable Dual-Wavelength Operation of an InGaAs-GaAs Ridge Waveguide Distributed Bragg Reflector Laser, IEEE Transactions on Photonics Letters, vol. 12, No. 1, Jan. 2000, pp. 16-18.

(Continued)

*Primary Examiner*—Minsun Harvey
*Assistant Examiner*—Marcia A. Golub
(74) *Attorney, Agent, or Firm*—Greer, Burns & Crain, Ltd

(57) ABSTRACT

Dual-wavelength operation is easily achieved by biasing the gain section. Multiple gratings spaced apart from each other are separated from an output aperture by a gain section. A relatively low coupling coefficient, κ, in the front grating reduces the added cavity loss for the back grating mode. Therefore, the back grating mode reaches threshold easily. The space section lowers the current induced thermal interaction between the two uniform grating sections, significantly reducing the inadvertent wavelength drift. As a result, a tunable mode pair separations (Δλ) as small as 0.3 nm and as large as 6.9 nm can be achieved.

4 Claims, 4 Drawing Sheets

U.S. PATENT DOCUMENTS

| | | | | |
|---|---|---|---|---|
| 5,708,674 | A | | 1/1998 | Beernink et al. ............. 372/50 |
| 5,748,660 | A | * | 5/1998 | Delorme et al. ......... 372/50.11 |
| 5,835,650 | A | | 11/1998 | Kitaoka et al. .............. 385/49 |
| 5,841,799 | A | | 11/1998 | Hiroki ......................... 372/19 |
| 6,122,306 | A | | 9/2000 | Sartorious et al. ............ 372/96 |
| 6,636,547 | B2 | * | 10/2003 | Evans et al. ................ 372/108 |
| 6,728,290 | B1 | * | 4/2004 | Coleman et al. ............ 372/102 |
| 2003/0081639 | A1 | * | 5/2003 | Duan et al. ................... 372/23 |

OTHER PUBLICATIONS

M. Maeda, T. Hirata, M. Suehiro, M. Hihara, A. Yamaguchi, H. Hosomatsu, "Photonic Integrated Circuit Combining Two GaAs Distributed Bragg Reflector Laser Diodes for Generation of the Beat Signal", Jpn. J. Appl. Phys. vol. 31, 1992, pp. 183-185.

C.E. Zah, F.J. Favire, B. Pathak, R. Bhat, C. Caneau, P.S.D. Lin, A.S. Gozdz, N.C. Andreadakis, M.A. Koza, T.P. Lee, "Monolithic Integration of Multiwavelength Compressive-Strained Multiquantum-Well Distributed-Feedback Laser Array with Star Coupler and Optical Amplifiers," Electron. Lett., vol. 28, 1992, pp. 2361-2362.

M.L. Osowski, R.M. Lammert, J.J. Coleman, "A Dual Wavelength Source with Monolithically Integrated Electyroabsorption Modulators and y-Junction Coupler by Selective-Area MOCVD," IEEE Photon. Technol. Lett., vol. 9, 1997, pp. 158-160.

J. Hong, R. Finlay, R. Tong, C. Rogers, D. Goodchild, "Simultaneous Dual-Wavelength Operation in Cascaded Strongly Gain-Coupled DFB Lasers," IEEE Photon, Tchnol. Lett., vol. 11, 1999, pp. 1354-1356.

S. Iio, M. Suehiro, T. Hirata, T. Hidaka, "Two-Longitudinal-Mode Laser Diodes," IEEE Photon, Technol. Lett. vol. 7, 1995, pp. 959-961.

Y. Matsui, M.D. Pelusi, S. Arahira, Y. Ogawa, "Beat Frequency Generation up to 3.4 Thz from Simultaneous Two-Mode Lasing Operation of Sampled-Grating DBR Laser," Electron. Lett. vol. 35, 1999, pp. 472-474.

A. Talneau, J. Charil, A. Ougazzaden, "Multiple Distributed Feedback Operation at 1.55 im with Uniform Output Powers in a Single Laser Diode", Electron Lett. vol. 75, 1999, pp. 600-602.

S.D. Roh,, R.B. Swint, A.M. Jones, T.S. Yeoh, A.E. Huber, J.S. Hughes, J.J. Coleman, "Dual-Wavelength Asvmettric Cladding InGaAs-GaAs Ridge Wavelength Distributerd Bragg Reflector Lasers," IEEE Photon, Technol. Lett. vol. 11, 1999, pp. 15-17.

P. Michler, M. Hilpert, G. Reiner, "Dynamics of Dual Wavelength Emission from a Coupled Semiconductor Microcavity Laser," App. Phys. Lett., vol. 70, 1997, pp. 2073-2075.

P. Pellandini, R.P. Stanley, R. Houdre, U. Oesteric, M. Ilegems, C. Weisbuch, "Dual Wavelength Laer Emission from a Coupled Semiconductor Microcavity", Appl. Phys. Lett., vol. 71, 1997, pp. 864-866.

T. Hidaka, Y. Hatano, "Simultaneous Two Wave Oscillation LD using Biperiodic Binary Grating", Electron Lett., vol. 27, 1991, pp. 1075-1076.

K. Lee, C. Shu, "Stable and Widely Tunable Dual Wavelength Continuous-Wave Operation of a Semiconductor Laser in a Novel Fabry-Perot Grating-Lens External Cavity", IEEE J. Quantum Electron., vol. 33, 1997, pp. 1832-1838.

H. Ishii, H. Tanobe, P. Kano, Y. Tohmori, Y. Kondo, Y. Yoshikuni, "Broad-Range Wavelength Coverage (62.4 nm) with Superstructure Grating DBR Laser", Electron Lett., vol. 32, 1996, pp. 454-455..

S. Lee, M. Heimbuch, D. Cohen, L. Coldren, S. DenBaars, "Integration of Semiconductor Laser Amplifiers with Sampled Grating Tunable Lasers for WDM Applications", IEEE J. Select. Topics Quantum Electron, vol. 3, 1997, pp. 615-627.

A. Talneau, C. Ougier, S. Slempkes, "Multiwavelgnth Grating Reflectors for Widely Tunable Laser", IEEE Photon. Technol. Lett., vol. 8, 1996, pp. 497-499.

R.M. Lammert, J.S. Hughes, S.D. Roh, M.L. Osowski, A.M. Jones, J.J. Coleman, "Low-Threshold NarrowLinewidth InGaAs-GaAs Ridge-Waveguide DBR Lasers with First-Order Surface Gratings", IEEE Photon, Technol. Lett. vol. 9, 1997, pp. 149-151.

R.M. Lammert, A.M. Jones, C.T. Youtsey, J.S. Hughes, S.D. Roh, I. Adesida, J.J. Coleman, "InGaAsP-InP Ridge-WAveguide DBR Lasers with First-Order Surface Gratings Fabricated Using CAIBE", IEEE Photon. Technol. Lett. vol. 9, 1997, pp. 1445-1447.

G.M. Smith, D.V. Forbes, J.J. Coleman, J.T. Verdeyen, "Optical Properties of Reactive Ion Etched Corner Reflector STrained-Layer InGaAs-GasAs-AlGaAs Quantum Well Lasers", IEEE Photon. Technol. Lett. vol. 5, 1993, pp. 873-876.

Lammert et al. "MQW DBR Lasers with Monolithically Integrated External-Cavity Electroabsorption Modulators Fabricated without Modification of the Active Region", IEEE Photonics Technology Letters, vol. 9, No. 5, May 1997, p. 566-568.

* cited by examiner

US 7,339,968 B2

CURRENT BIASED DUAL DBR GRATING SEMICONDUCTOR LASER

REFERENCE TO RELATED APPLICATION AND PRIORITY CLAIM

This application is a continuation application of and related to U.S. application Ser. No. 09/660,611, filed on Sep. 13, 2000, now U.S. Pat. No. 6,728,290, and claims priority from that application under 35 U.S.C. §120.

STATEMENT OF GOVERNMENT INTEREST

This invention was made with government assistance under National Science Foundation grant ECS 99-00258 and the Air Force Office of Scientific Research contract F49620-96-1-0163 COL. The Government has certain rights in this invention.

FIELD OF THE INVENTION

The field of the invention is semi conductor lasers.

BACKGROUND OF THE INVENTION

Multiwavelength optical sources are important components in applications such as wavelength division multiplexing, optical remote sensing, and optical data processing. Multiple wavelengths are commonly achieved from a single output by integrating the output from multiple, discrete lasers. This can lead to large and complex chip design, however. Other approaches, such as cascaded strongly gain-coupled DFB (distributed feedback) lasers, rely on the reflectivity comb from integrated multi wavelength feedback mechanisms for their operation. Such integrated design of the multi wavelength feedback makes it difficult to select and tune a wavelength while leaving other wavelength(s) unaffected.

Thus, there is a need for an improved semiconductor laser capable of dual wavelength operation. It is an object of the invention to provide such a laser.

SUMMARY OF THE INVENTION

In the present laser, dual-wavelength operation is easily achieved by biasing the gain section. Multiple gratings spaced apart from each other are separated from an output aperture by a gain section. A relatively low coupling coefficient, K, in the front grating reduces the added cavity loss for the back grating mode. Therefore, the back grating mode reaches threshold easily. The space section lowers the current induced thermal interaction between the two uniform grating sections, significantly reducing the inadvertent wavelength drift. As a result, a tunable mode pair separations ($\Delta\lambda$) as small as 0.3 nm and as large as 6.9 nm can be achieved.

DETAILED DESCRIPTION OF THE PREFERRED EMBODIMENT

Figure 1:
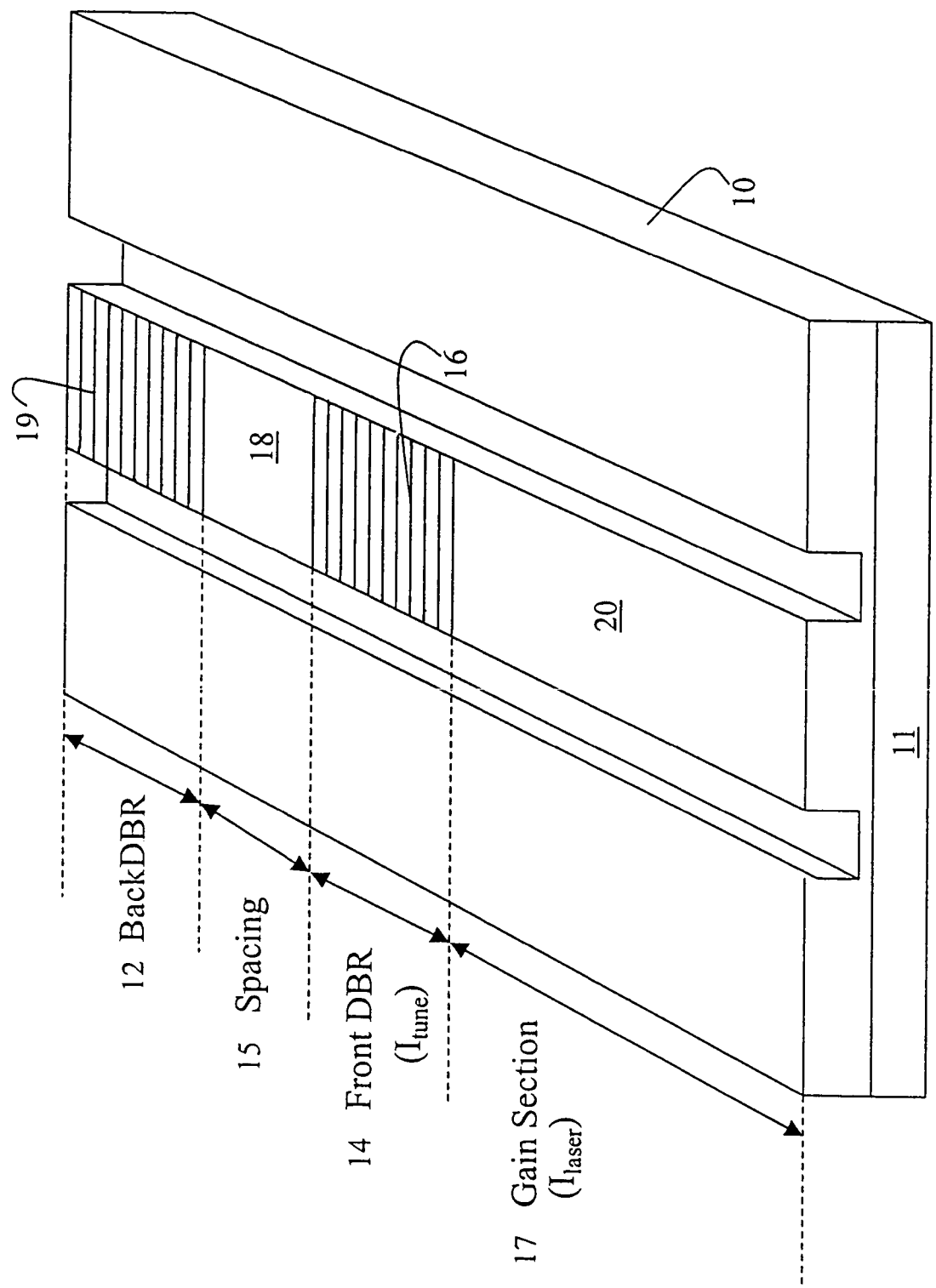
FIG. 1 is a schematic diagram of a preferred RW-DBR laser heterostructure of the invention.

Referring now to FIG. 1, a preferred ridge waveguide-distributed Bragg reflector (RW-DBR) laser heterostructure 10 of the invention is shown. The laser heterostructure emits from an output aperture 11. A rear surface distributed Bragg grating 12 is formed on a surface of said laser heterostructure. The laser also includes a front surface distributed Bragg grating 14 on a surface of said laser heterostructure. The front surface distributed Bragg grating 14 is closer to the output aperture 11 than the rear surface distributed Bragg grating 12. There is a space 15 between the rear surface distributed Bragg grating 12 and the front surface distributed Bragg grating 14. A tuning electrode 16 is formed on the front surface distributed Bragg grating 14, and the region between the front distributed Bragg grating and the output aperture 11 forms a gain section 17. A current drive electrode 18 is formed on the space 15, and a tuning electrode 19 on the rear surface distributed Bragg grating. An additional current drive electrode 20 is formed on the gain section 17. Operation is best when the front surface distributed Bragg reflector 14 has an optimal design such that adequate reflectivity at the Bragg wavelength is obtained with minimal scattering loss at other wavelengths, particularly that of the rear surface distributed Bragg grating 12. The coupling coefficient of the rear surface distributed Bragg grating 12 is less critical and may be higher than that of the front surface distributed Bragg grating 14. Prototypes have been formed and tested. Their operation illustrates some advantages of the invention, but the particular prototype parameters, i.e. grating dimensions, separation lengths, etc., do not limit the broader aspects of the overall structure which forms part of the invention as shown in FIG. 1. The prototypes and their operation will now be discussed.

In prototypes which were tested, uniform front and back gratings with an identical period were used, and current injection into the tuning electrode 16 defined the wavelength separation between the mode pairs. The laser operates in a single-wavelength mode with no current applied to the tuning electrode 16, and dual-wavelength operation is achieved when current is applied to the tuning electrode 16. The prototype InGaAs-GaAs asymmetric cladding RW-DBR lasers operate in a dual-wavelength mode with tunable mode pair separations as small as 0.3 nm and as large as 6.9 nm.

Epitaxial layers for the asymmetric cladding separate confinement heterostructure (SCH) prototypes were grown by atmospheric pressure metalorganic chemical vapor deposition (MOCVD) in a vertical reactor on a (100) GaAs:n$^+$ substrate. After the growth, silicon dioxide was deposited by plasma-enhanced chemical vapor deposition. Grating periods were defined by electron beam lithography. The gratings were transferred into the silicon dioxide using Freon 23 reactive ion etching (RIE). Plasma-Therm SLR inductively-coupled plasma (ICP) RIE was used to etch the gratings into the epitaxial layers with $SiCl_4$. A 4 µm lateral ridge was defined using standard photolithography and etched in a sulfuric acid solution. A liftoff metallization was performed to provide separate contacts for the laser and the tuning elements. No coatings are applied to the facets. The prototype DBRs utilize uniform gratings with the same Bragg period, but gratings having different periods will also work within the above described limitations of reflectivity and scattering losses. The metal liftoff was aligned over the gratings to provide electrical isolation for the common gain section and the two DBR sections. The two DBR sections are physically separated in order to reduce the inadvertent heating mentioned.

Three different device dimensions were investigated. Table I is a summary of physical dimensions of these devices. The ridge heights and ridge widths for all three devices are 0.15 µm and 3.5 µm, respectively. All prototype DBRs had a uniform grating with a period of 166.0 nm.

TABLE I

| Device | (a) | (b) | (c) |
|---|---|---|---|
| $L_{gain}$ | 500 | 525 | 550 |
| $L_{front\ DBR}$ | 100 | 75 | 50 |
| $L_{space}$ | 100 | 75 | 50 |
| $L_{back\ DBR}$ | 100 | 100 | 100 |

Figure 2:
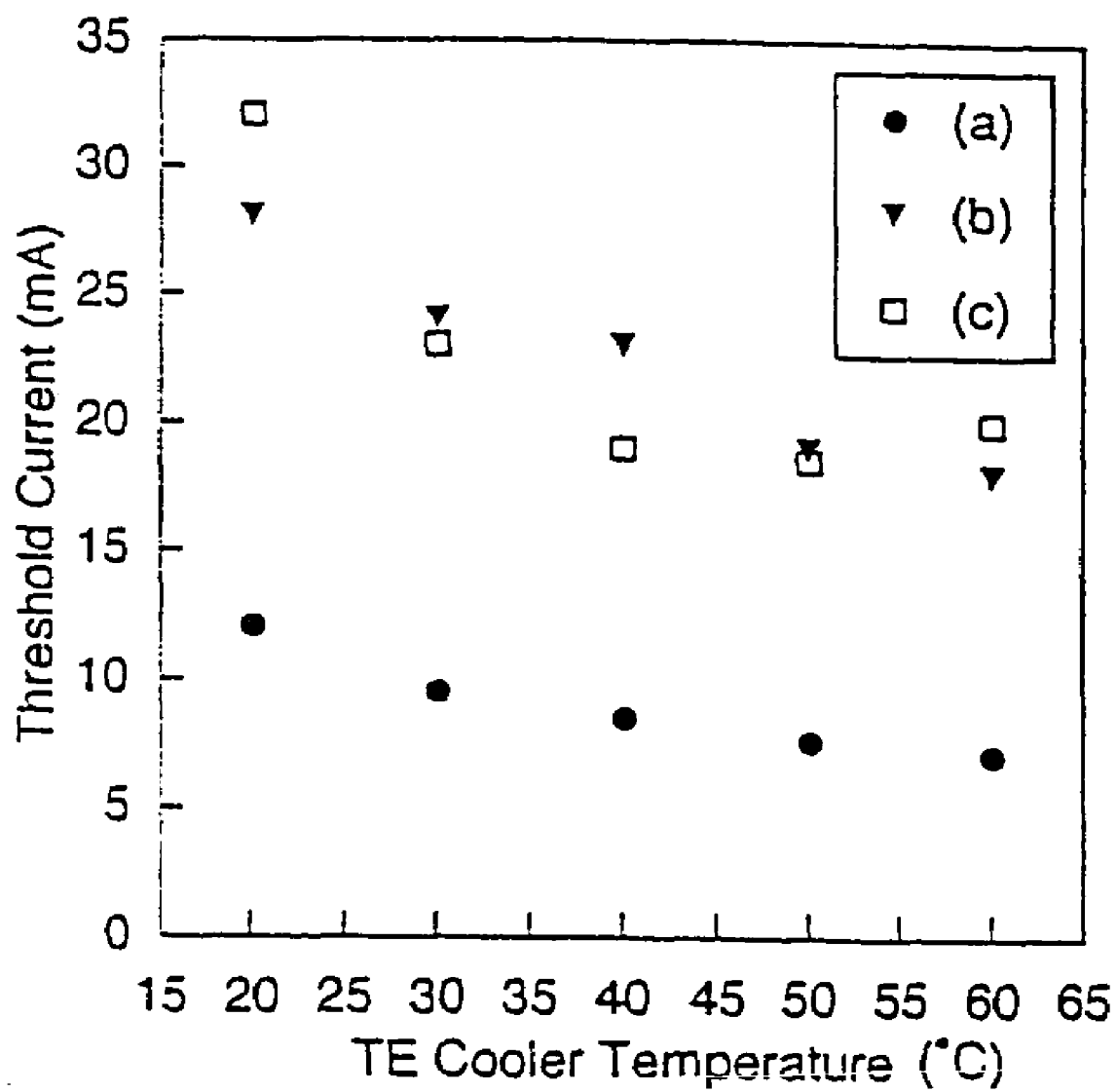
FIG. 2 illustrates threshold currents for three prototype devices of the invention measured at different temperatures ranging from 20 EC to 60 EC.

Prototype testing was performed continuous wave (CW) with a heat sink temperature maintained by a thermoelectric (TE) cooler. Only the gain section is biased to achieve lasing. FIG. 2 shows threshold currents for the three different devices in Table I measured at different temperatures. At 20EC, the threshold currents for devices (a), (b), and (c) are 12 mA, 28 mA, and 32 mA, respectively, and the uniform grating period of 166.0 nm results in a single nominal lasing wavelength ($\lambda_{front}$) of ~1077.4 nm. As expected, device (a), with the shorter gain section and the longer front DBR section (i.e. stronger reflectivity), exhibits the lowest threshold current for all temperatures. FIG. 2 also shows that the threshold currents decrease for all three devices as the TE cooler temperature is increased from 20EC to 60EC. Threshold currents for devices (a), (b), and (c) are as low as 7.1 mA, 18 mA, and 18.5 mA, respectively. This trend can be accounted for by the Bragg condition being red-shifted with respect to the gain peak. As the temperature of the device increases, the gain peak tunes toward the Bragg condition, leading to a lower threshold current. As expected, no lasing is observed when only the tuning pad is biased.

Dual-wavelength operation occurs in devices (b) and (c) when the lasers are biased high enough to support two lasing modes. Both devices exhibit similar trends in their performance. No additional current is required for dual-wavelength operation. The coupling coefficient, κ, of the front DBR is estimated to be ~80 cm$^{-1}$. This lower value of κ is believed to be an important feature that contributes to the dual-wavelength operation of these devices. For these devices with deeply etched surface gratings, the higher threshold condition for the second lasing mode for the back DBR ($\lambda_{back}$) results from the added cavity loss caused by scattering in the front DBR. By reducing the loss caused by the front grating section, $\lambda_{back}$ reaches threshold more easily. While device (a) exhibits the lowest threshold current, it does not exhibit dual-wavelength operation. Because the added loss for $\lambda_{back}$ in device (a) with the longest front grating ($L_f$) and the spacing ($L_S$) sections, $\lambda_{back}$ does not reach threshold. Therefore, a low κL product for the front grating is an important factor determining the threshold condition of $\lambda_{back}$. However, κ for the front grating still needs to be sufficiently high in order for the front grating to act as a good wavelength-selective reflector. Minimizing cavity loss for the back grating section should be carefully balanced with sufficient reflection for $\lambda_{back}$.

Figure 3:
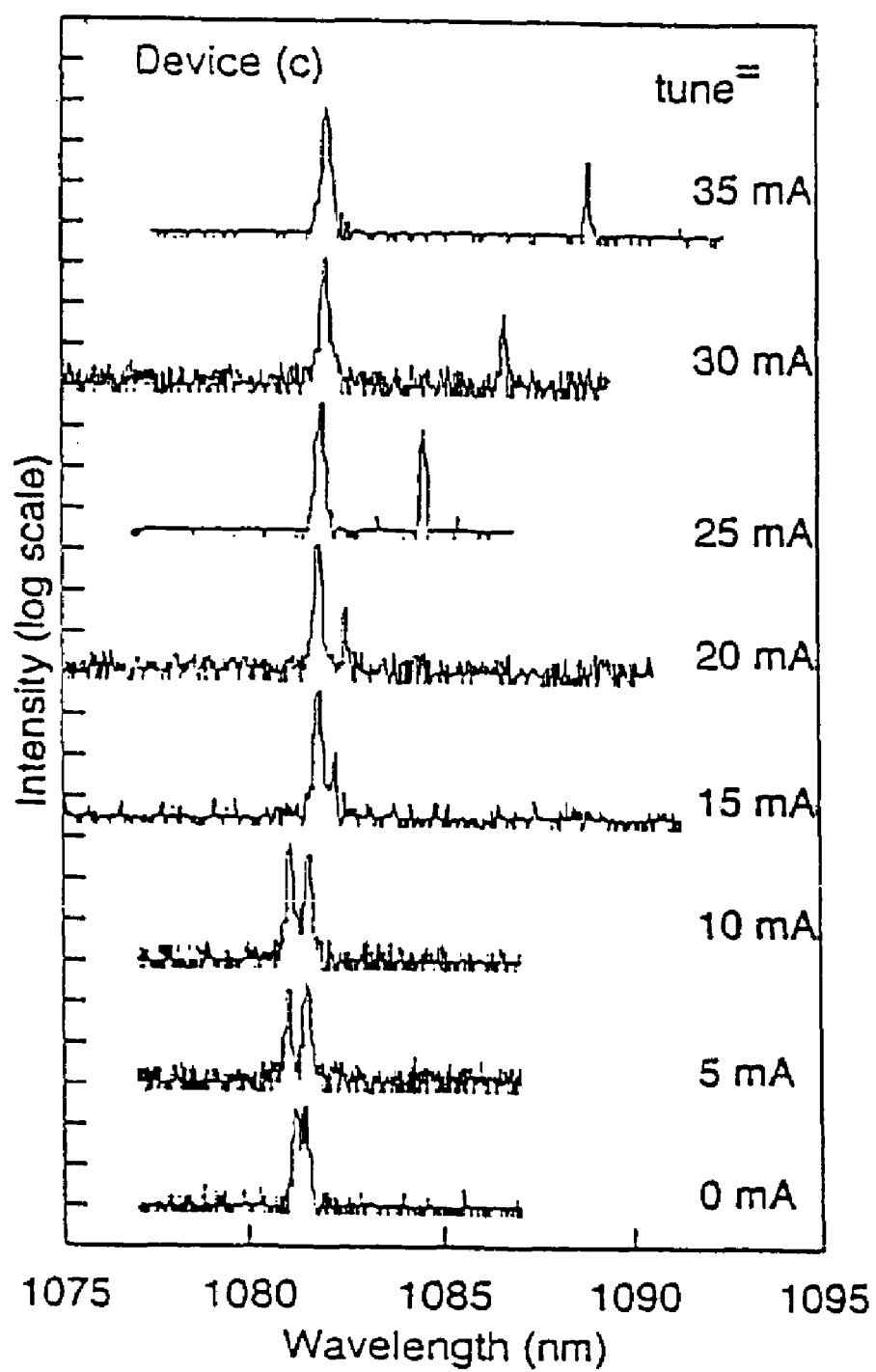
FIG. 3 illustrates longitudinal mode spectra of a prototype device measured at different tuning currents from O mA to about 35 mA with the laser current fixed at 50 mA at 60EC.
Figure 4:
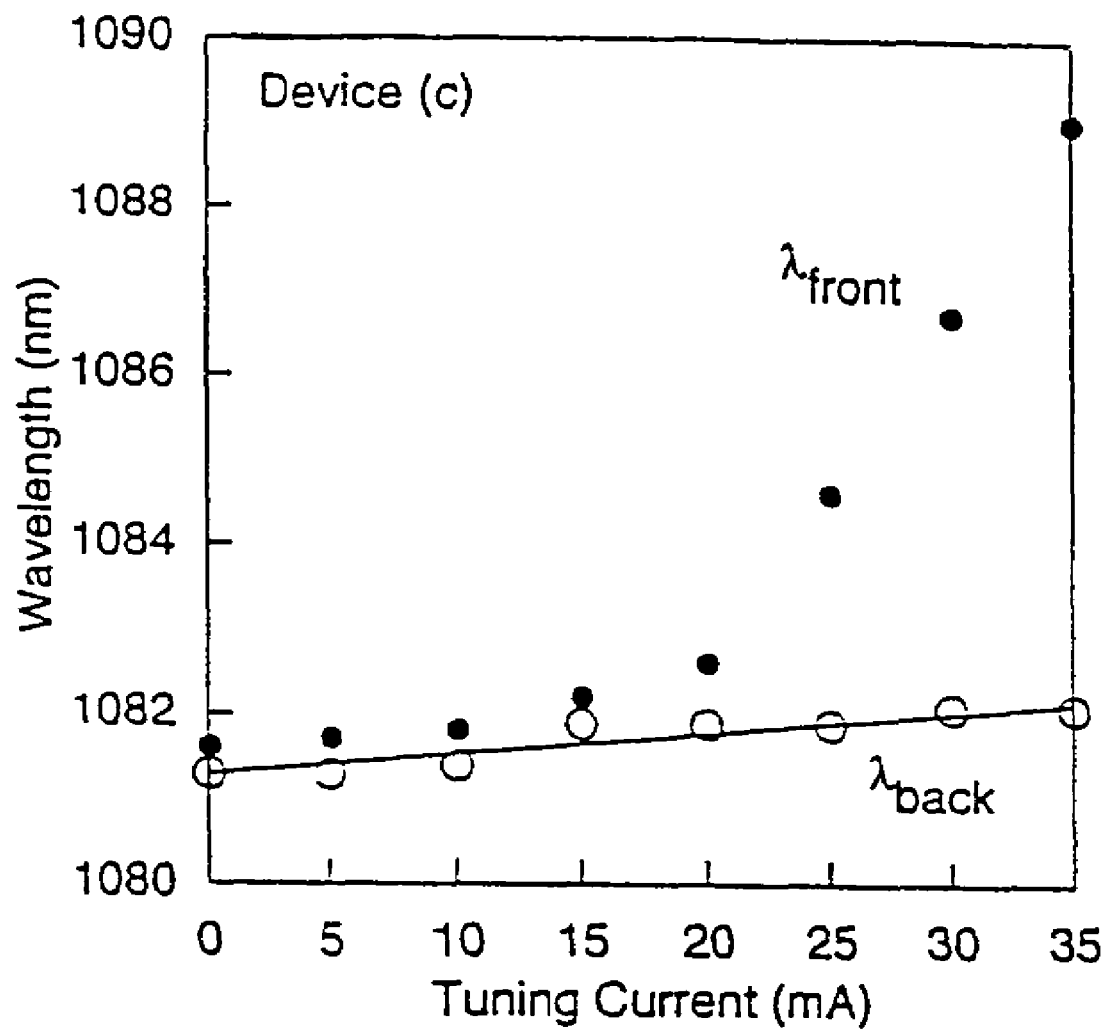
FIG. 4 shows peak wavelengths of the prototype laser measured in FIG. 3.

Once dual-wavelength operation is achieved by biasing the gain section, injection of current into the front DBR section results in wavelength tuning. FIG. 3 shows the longitudinal mode spectra of device (c) measured at different tuning currents from 0 mA to 35 mA with the laser current fixed at 50 mA at 60EC. As noted earlier, the gain peak of the material overlaps better with the Bragg condition at elevated operating temperatures, facilitating dual-wavelength operation and therefore, tuning. Because of thermal coupling between the gain section and the front DBR, the wavelength of $\lambda_{front}$ is slightly longer than $\lambda_{back}$. FIG. 4 shows the peak wavelengths the RW-DBR laser presented in FIG. 3. Closed circles represent the front DBR mode ($\lambda_{front}$), and open circles represent the back DBR mode ($\lambda_{back}$). As the tuning current increases, both modes shift towards longer wavelengths, with the tunable wavelength shifting further. When the tuning current is increased from 0 mA to 35 mA, $\lambda_{front}$ increases by 7.4 nm, tuning from 1081.6 nm to 1089.0 nm. Therefore, the RW-DBR laser exhibits a tunable mode pair separation (Δλ) as small as 0.3 nm and as large as 6.9 nm. At higher currents $\lambda_{front}$ jumps a lower wavelength that is more favorable for lasing. Device (b) also exhibits similar trends. FIG. 4 also illustrates the effect of inserting a 50 -µm spacing section to reduce the inadvertent drifting of $\lambda_{back}$. When the tuning current is increased from 0 mA to 40 mA, the wavelength of $\lambda_{back}$ increases by only 0.9 nm, from 1081.3 nm to 1082.2 nm (0.025 nm/mA). For device (b), which has a longer spacing section (75 µm), the drift in $\lambda_{back}$ is further reduced to ~0.015 nm/mA.

Thus, by simply biasing the gain section, a laser of the invention operates in dual-wavelength. Lower coupling coefficient, κ, in the front grating reduces the added cavity loss for the back DBR mode $\lambda_{back}$, and therefore, $\lambda_{back}$ reaches threshold more easily. Also, the addition of a spacing section reduces the current induced thermal interaction between the two uniform grating sections, significantly reducing the inadvertent wavelength drift. As a result, a tunable mode pair separations (Δλ) as small as 0.3 nm and as large as 6.9 nm can be achieved.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A semiconductor laser, the laser comprising:
   a laser heterostructure having an active layer, a lateral waveguide terminating in an output aperture, and a gain section; and
   means for simultaneously producing multiple wavelength output;
   wherein said means for simultaneously producing multiple wavelength output comprises front and rear distributed Bragg gratings separated from each other, the gain section being disposed between said front distributed Bragg grating and said output aperture;
   wherein said front distributed Bragg grating provides adequate reflectivity at its Bragg wavelength and minimal scattering losses at other wavelengths;
   wherein said rear distributed Bragg grating has a higher coupling coefficient than said front distributed Bragg grating.

2. A semiconductor laser, the laser comprising:
   a laser heterostructure having an active layer, a lateral waveguide terminating in an output aperture, and a gain section; and means for simultaneously producing multiple wavelength output;

wherein said means for simultaneously producing multiple wavelength output comprises front and rear distributed Bragg gratings separated from each other, the gain section being disposed between said front distributed Bragg grating and said output aperture;

wherein said rear distributed Bragg grating has a higher coupling coefficient than said front distributed Bragg grating.

3. A semiconductor laser, the laser comprising:

a laser heterostructure having an active layer, a lateral waveguide terminating in an output aperture, and a gain section; and means for simultaneously producing multiple wavelength output;

wherein said means for simultaneously producing multiple wavelength output comprises front and rear distributed Bragg gratings separated from each other, the gain section being disposed between said front distributed Bragg grating and said output aperture;

wherein said front distributed Bragg grating has a coupling coefficient and length product that is set to permit a low enough threshold current in the rear distributed Bragg grating, while the coupling coefficient is high enough for the front distributed Bragg grating to act as a wavelength selective reflector.

4. A semiconductor laser, the laser comprising:

a substrate;

a confinement heterostructure;

a ridge waveguide cladding layer, the ridge waveguide cladding layer including a rear distributed Bragg grating separated by a space from a front distributed Bragg grating, the space having no grating, the front distributed Bragg grating being closer to an output aperture than the rear distributed Bragg grating and being separated from the output aperture by a gain section, wherein the lengths of the gain section, the front and rear distributed Bragg gratings being uniform, and the space are selected for dual wavelength operation and the space lowers the current induced thermal interaction between the front and rear distributed Bragg gratings;

a first tuning electrode formed on the front distributed Bragg grating;

a first current drive electrode formed on the space;

a second tuning electrode formed on the rear surface distributed Bragg grating; and a second current drive electrode formed on the gain section.

* * * * *

UNITED STATES PATENT AND TRADEMARK OFFICE
CERTIFICATE OF CORRECTION

PATENT NO. : 7,339,968 B2 Page 1 of 1
APPLICATION NO. : 10/778599
DATED : March 4, 2008
INVENTOR(S) : James J. Coleman et al.

It is certified that error appears in the above-identified patent and that said Letters Patent is hereby corrected as shown below:

Title Pg, Item (56) References Cited, OTHER DOCUMENTS

Page 2, Col. 2, reference, "A. Taineau" delete "Multiwavelgnth" and insert -- Multiwavelength -- therefor.

Signed and Sealed this

Eighth Day of July, 2008

JON W. DUDAS
*Director of the United States Patent and Trademark Office*